United States Patent
Yoshimoto et al.

(10) Patent No.: US 8,354,584 B2
(45) Date of Patent: Jan. 15, 2013

(54) DYE SENSITIZED SOLAR CELL

(75) Inventors: Naoki Yoshimoto, Hitachinaka (JP); Hiroto Naito, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 784 days.

(21) Appl. No.: 12/145,586

(22) Filed: Jun. 25, 2008

(65) Prior Publication Data

US 2009/0000661 A1 Jan. 1, 2009

(30) Foreign Application Priority Data

Jun. 29, 2007 (JP) ................................ 2007-171411

(51) Int. Cl.
*H01L 31/00* (2006.01)

(52) U.S. Cl. ........ 136/256; 136/263; 136/251; 136/252; 438/71; 438/72; 438/73; 438/57; 427/80; 427/74; 429/111

(58) Field of Classification Search ............... 136/256, 136/263, 252, 251; 438/71, 72, 73, 57; 427/80, 427/74; 429/111
See application file for complete search history.

(56) References Cited

U.S. PATENT DOCUMENTS

| | | | | |
|---|---|---|---|---|
| 6,069,313 A * | 5/2000 | Kay | | 136/249 |
| 6,462,266 B1 * | 10/2002 | Kurth | | 136/251 |
| 6,469,243 B2 * | 10/2002 | Yamanaka et al. | | 136/263 |
| 6,657,119 B2 * | 12/2003 | Lindquist et al. | | 136/251 |
| 7,145,071 B2 * | 12/2006 | Spivack et al. | | 136/263 |
| 2005/0072458 A1 | 4/2005 | Goldstein | | |
| 2006/0102229 A1 * | 5/2006 | Miyoshi et al. | | 136/263 |
| 2007/0163645 A1 * | 7/2007 | Gonda et al. | | 136/263 |
| 2009/0235982 A1 * | 9/2009 | Okada et al. | | 136/256 |

FOREIGN PATENT DOCUMENTS

| | | |
|---|---|---|
| DE | 603 03 301 | 10/2006 |
| EP | 1 509 936 | 3/2005 |
| EP | 1 791 196 | 5/2007 |
| JP | 2003-203682 | 7/2003 |

(Continued)

OTHER PUBLICATIONS

JP 2005-346971 A online machine translation provided by The Industrial Property Digital Library, and translated on Nov. 24, 2011.*

(Continued)

*Primary Examiner* — Jonathan Johnson
*Assistant Examiner* — Golam Mowla
(74) *Attorney, Agent, or Firm* — Antonelli, Terry, Stout & Kraus, LLP.

(57) ABSTRACT

An object of the present invention is to provide an enlarged dye sensitized solar cell which has a short-circuit preventing structure while a distance between a transparent conductive oxide and a counter electrode, that is, a cell gap is shortened. The dye sensitized solar cell includes a transparent conductive oxide which includes a transparent substrate and a conductive metal oxide having a light transmission property; a metal grid which is formed on the transparent conductive oxide; a protective film with which the metal grid is coated; a dye-adsorbed semiconductor thin film which is formed on the transparent conductive oxide in which the metal grid is not formed; and a counter electrode substrate, wherein a short-circuit preventing layer is provided in the counter electrode substrate facing the metal grid, and a width formed by a short side of the short-circuit preventing layer is larger than a width formed by the metal grid and protective layer.

11 Claims, 2 Drawing Sheets

FOREIGN PATENT DOCUMENTS

| | | | |
|---|---|---|---|
| JP | 2004-296203 | | 10/2004 |
| JP | 2005-346971 | A * | 12/2005 |
| JP | 2006-107892 | A1 * | 4/2006 |
| JP | 2006-261090 | A * | 9/2006 |
| JP | 2008-147037 | A * | 6/2008 |
| WO | WO 96/29716 | | 9/1996 |

OTHER PUBLICATIONS

Office Action of DE 10 2008 030 398.4 dated Sep. 15, 2009.

* cited by examiner

PRIOR ART

DYE SENSITIZED SOLAR CELL

BACKGROUND OF THE INVENTION

1. Field of the Invention

The present invention relates to a module structure of a dye sensitized solar cell.

2. Description of the Related Art

A photovoltaic power system is actively being developed in order to promote effective utilization of natural energy. Currently a solar cell which generates photovoltaic power has been mainly made from single-crystal or poly-crystalline silicon. However, the photovoltaic power generation has not yet led to become widespread because of unstable supply of raw silicon or insufficient cost reduction in process.

The dye sensitized solar cell which is created by professor Graetzel of Switzerland receives attention as a low-cost solar cell because silicon is not used as the raw material. A sectional view of a conventional dye sensitized solar cell is schematically shown in FIG. 4. The dye sensitized solar cell includes a transparent conductive oxide 23, a dye-adsorbed semiconductor thin film 33 which is adjacent to the transparent conductive oxide 23, a counter electrode 43, and an electrolytic solution 51.

The transparent conductive oxide 23 is used as a light acceptance-side electrode. Generally, the transparent conductive oxide 23 is produced by depositing a conductive metal oxide 22 on a transparent substrate 21 made of soda lime glass. FTO (Fluorine-doped Tin Oxide) or ITO (Indium Tin Oxide) is used as the conductive metal oxide 22.

The dye-adsorbed semiconductor thin film 33 includes a metal oxide 31 such as a titanium oxide having a semiconductive property which is formed into porous shape and is adjacent to the conductive metal oxide 22, and a sensitizing dye 32 is supported on a surface of the metal oxide 31.

The counter electrode 43 includes a conductive substrate 41 and a catalytic layer 42 which promotes a chemical reaction of an electrolyte and is supported on the conductive substrate 41. The catalytic layer 42 includes platinum or carbon.

The counter electrode 43 and the dye-adsorbed semiconductor thin film 33 retained by the transparent conductive oxide 23 are disposed so as to face each other, and a sealing agent 61 is applied to a peripheral portion of the substrate with a predetermined gap. The two electrodes 22 and 43 are bonded to each other with the sealing agent 61 interposed therebetween, thereby producing a cell. An electrolyte containing a redox mediator which is made of iodine and an iodide ion is charged into the gap between the electrodes 22 and 43 through an electrolytic filling hole 71 to form a charge transporting electrolytic solution 51.

A nitrile organic solvent having a relatively large dielectric constant is mostly used as the electrolytic solution 51. There is an attempt to use an ambient temperature molten salt (ionic solution) to prevent volatilization of the electrolyte. In a mobile liquid, there is a risk of leakage during production or cell breakage. Therefore, an attempt to quasi-solidify the mobile liquid, that is, to turn into a gel is provided to prevent the leakage of the mobile liquid.

For enlargement of the dye sensitized solar cell, because the metal oxide 22 deposited on the transparent conductive oxide has a sheet resistance as large as several $\Omega/\square$, a series resistance of the cell is increased as the dye sensitized solar cell is enlarged. Therefore, generally a collector electrode is placed in the transparent conductive oxide 23. A sectional view of a conventional dye sensitized solar cell in which a collector electrode is provided is schematically shown in FIG. 5. There are various collector electrode structures. Generally, a metal grid 81 is provided adjacent to the metal oxide 22, and a protective layer 82 is provided such that the metal grid 81 does not contact the electrolytic solution 51 (for example, see Japanese Patent Application Laid-Open No. 2003-203682).

Generally, the redox mediator containing the iodine and iodide ion is used as the electrolyte of the dye sensitized solar cell. Because many kinds of metals are corrosive for the redox mediator containing the iodine and iodide ion, it is necessary to protect the metal grid 81. A dielectric material such as a resin and glass frit is used as the protective layer 82.

In order to enhance efficiency of the enlarged dye sensitized solar cell, it is necessary to decrease the increased electric resistance caused by the enlargement. The increased electric resistance caused by the enlargement can mainly be divided into the sheet resistance of the metal oxide of the transparent conductive oxide and a dielectric resistance of the electrolyte which is increased in proportion to a distance between the transparent conductive oxide and the counter electrode. Although the sheet resistance can be decreased by placing the collector electrode, it is necessary to devise a sectional structure of the solar cell in the distance between the transparent conductive oxide and the counter electrode.

However, the collector electrode, the protective layer, and the like are provided in the transparent conductive oxide to complicate the structure. Therefore, a corner portion of the protective layer is broken when the distance with the counter electrode is shortened, which possibly causes a short circuit of the solar cell. In order to prevent the short circuit, it is necessary to obtain the dye sensitized solar cell in which the distance between the transparent conductive oxide and the counter electrode is shortened as much as possible without generating the breakage of the protective layer which causes the short circuit.

SUMMARY OF THE INVENTION

An object of the invention is to provide an enlarged dye sensitized solar cell which has a short-circuit preventing structure while a distance between a transparent conductive oxide and a counter electrode, that is, a cell gap is shortened.

According to an aspect of the invention, there is provided a dye sensitized solar cell including a transparent conductive oxide which includes a transparent substrate and a conductive metal oxide having a light transmission property; a dye-adsorbed semiconductor thin film and a metal grid which are formed on the transparent conductive oxide; a substrate with which a protective layer is provided and a counter electrode substrate, wherein a region not having a light transmission in a transparent conductive oxide, which is a region a short-circuit preventing layer is provided more widely in a plane direction than a region which includes a collector electrode and a protective layer, thereby a short-circuit between a counter electrode substrate and a collector electrode can be prevented in a case a cell gap is shortened.

Accordingly, the physical contact between the collector electrode and the counter electrode which causes the short circuit of the dye sensitized solar cell can be prevented while the cell gap is decreased in the portion necessary for the power generation.

Preferred embodiments of the invention will be described below with reference to the drawings. However, the invention is not limited to the embodiments as long as the action and effect are satisfied. For the purpose of easy understanding, a reduction scale is not always correct in the drawings.

EXPLANATIONS OF LETTERS OR NUMERALS

| | |
|---|---|
| 21: | Transparent substrate |
| 22: | Conductive metal oxide |
| 23: | Transparent conductive oxide |
| 31: | Metal oxide having semiconductor property |
| 32: | Sensitizing dye |
| 33: | Dye-adsorbed semiconductor thin film |
| 41: | Conductive substrate |
| 42: | Catalytic layer |
| 43: | Counter electrode |
| 44: | Chassis constituting counter electrode |
| 51: | Electrolytic solution |
| 61: | Sealing agent |
| 71: | Filling hole |
| 81: | Metal grid |
| 82: | Protective layer |

DESCRIPTION OF THE PREFERRED EMBODIMENTS

First Embodiment

Figure 1:
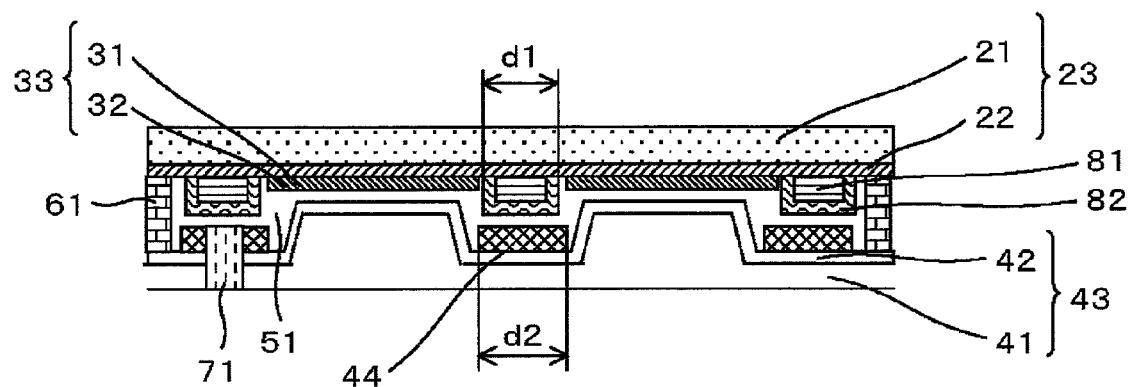
FIG. 1 is a sectional view showing a main part of a dye sensitized solar cell according to a first embodiment of the invention.

FIG. 1 is a schematic sectional view showing an example of a main part of a dye sensitized solar cell according to a first embodiment of the invention.

The dye sensitized solar cell of FIG. 1 includes a dye-adsorbed semiconductor thin film 33, a transparent conductive oxide 23, a counter electrode 43, a chassis 44, and an electrolytic solution 51. The dye-adsorbed semiconductor thin film 33 includes a porous metal oxide 31 and a sensitizing dye 32 which adsorbs light. The transparent conductive oxide 23 includes a transparent substrate 21 and a transparent substrate 22 made of a metal oxide. The chassis 44 is placed so as to contact the counter electrode 43, and the chassis 44 constitutes the counter electrode 43. The electrolytic solution 51 is provided in at least a part of a space between the transparent conductive oxide 23 and the counter electrode 43.

A metal grid 81 made of metal is provided on the transparent conductive oxide 23 in order to decrease a sheet resistance of the transparent electrode, and a protective layer 82 is provided such that the metal grid 81 does not contact the electrolytic solution 51. The metal grid 81 and the protective layer 82 have thicknesses of tens micrometers when the metal grid 81 and the protective layer 82 are formed by a screen printing method.

Each component of the first embodiments will be described below.

The transparent substrate 21 constituting the transparent conductive oxide 23 acts as a chassis of the dye sensitized solar cell. Because the transparent conductive oxide 23 is a light acceptance surface, it is necessary that the transparent substrate 21 have an optical transmission property in a visible light range. A transparent and rigid material, such as soda glass, an acrylic resin, and a polycarbonate resin, can be cited as an example of the transparent substrate 21.

Because the light acceptance surface is also formed by the transparent substrate 22 constituting the transparent conductive oxide 23, it is necessary that the transparent substrate 22 have the optical transmission property. Examples of the transparent electrode having the conductive property include ITO (Indium Tin Oxide) which is formed by adding several-percent tin into an indium oxide and FTO (Fluorine-doped Tin Oxide) which is obtained by adding fluorine into tin. When ITO is heated in the presence of oxygen, the oxygen is incorporated into the ITO film to increase the sheet resistance. In order to constrain the increase in sheet resistance caused by heating ITO, a metal oxide such as FTO or ATO (Antimony-doped Tin Oxide) is effectively deposited in an interface between ITO and atmosphere. The metal oxide laminated structure can constrain the oxygen from penetrating through ITO during the heating.

A thin film of the transparent substrate 22 can be formed by a vacuum process such as sputtering and CVD (Chemical Vapor Deposition). Additionally, an indium or tin organometallic compound solution is applied by a method such as spin coating, and the indium or tin organometallic compound solution is oxidized to form a thin film by a heating treatment. There is also effectively adopted a spray thermal decomposition method, in which an FTO precursor compound is sprayed on the heated substrate and the thin film is formed by the thermal decomposition.

A porous metal oxide 31 having a semiconductive property is provided on the transparent substrate 22. There is no particular limitation to the semiconductor of which the porous semiconductor layer is made. Usually, any semiconductor can be used as long as the semiconductor is used to form the porous semiconductor for the solar cell. For example, $TiO_2$, $SnO_2$, $WO_3$, $ZnO$, $Nb_2O_5$, $In_3O_3$, $ZrO_2$, $Ta_2O_5$, $La_2O_3$, $SrTiO_3$, $Y_2O_3$, $Ho_2O_3$, $Bi_2O_3$, $CeO_2$, $Al_2O_3$ can be used as the semiconductor. Example of the porous film forming method include film formation by a sol-gel method, migration electro-deposition of fine particles, a porous semiconductor formed by a foaming agent, and a method of removing an excess component after a mixture of a semiconductor and a polymer is applied, but is not limited to these methods.

The following conditions are necessary for a sensitizing dye 32 supported on the metal oxide. It is necessary that an LUMO (Lowest Unoccupied Molecular Orbital) level of the sensitizing dye 32 be equal to a Fermi level of the porous metal oxide 31 or higher than that on a vacuum level side. When LUMO is lower than the Fermi level of the metal oxide, an energy barrier is generated in injecting an excited electron sensitized by the dye into the metal oxide, thereby lowering the photoelectric conversion efficiency.

Desirably a dye which can adsorb an optical energy range as much as possible is used in order to improve the photoelectric conversion efficiency. Therefore, the light having a visible range constituting a wavelength range longer than an ultraviolet wavelength of 400 nm to 900 nm is adsorbed at a level equal or larger than the light of the ultraviolet range using the dye having the wide absorption wavelength.

Examples of the sensitizing dye satisfying the necessary condition and the desirable condition includes a ruthenium complex in which a bipyridine structure and a terpyridine structure are included in a ligand, a metal-containing complex such as porphyrin and phthalocyanine, and an organic dye such as eosine, rhodamine, and merocyanine.

A dye-adsorbed semiconductor thin film 33 is formed by supporting the sensitizing dye 32 on porous metal oxide 31. For the method of supporting the sensitizing dye 32, usually, the porous metal oxide 31 is dipped for a predetermined time in a solution in which the dye is dissolved. At this point, desirably, the sensitizing dye 32 is adsorbed in a monomolecular manner on a surface of the porous metal oxide 31. Therefore, extinction of a photo-excited electron of the sensitizing dye can be prevented to achieve the improvement of the photoelectric conversion efficiency.

Usually, the transparent substrate 22 used in the transparent conductive oxide has the sheet resistance of several $\Omega/\square$, and an internal resistance of the dye sensitized solar cell is increased by the enlargement of the transparent conductive oxide. A metal grid 81 is provided on the transparent substrate 22 in order to constrain the internal resistance. This enables the sheet resistance of the transparent electrode to be prevented from increasing the internal resistance. Various kinds of metal grids such as silver, nickel, chromium/copper wirings which closely contacts the transparent electrode can be used as the metal grid 81. A paste material containing metal particles closely contacts the transparent electrode by a predetermined method, which allows the metal grid 81 to be easily produced. Alternatively, the metal grid 81 may also be produced by sputtering or plating.

In the metal electrode wiring, there is no particular limitation to a wiring structure in the surface of the transparent conductive oxide when the internal resistance caused by the sheet resistance of the transparent electrode is constrained. Examples of the wiring structure include a lattice-shape structure, a stripe-shape structure, and a strip-shape structure. Preferably, a gap constituting a channel in charging the electrolytic solution is provided.

In the dye sensitized solar cell, usually, the redox mediator including the iodine and the iodide ion is contained in the electrolytic solution 51, and many kinds of metals are corrosive for the redox mediator. Therefore, a protective layer 82 is disposed such that the metal grid 81 does not contact the electrolytic solution. The protective layer 82 made of the glass frit or resin can be placed by a printing method.

The total thickness of the metal grid 81 and protective layer 82 reaches tens micrometers when the metal grid 81 and protective layer 82 are applied by the screen printing. In the dye sensitized solar cell, when the thickness of the electrolytic solution is increased, the photoelectric conversion efficiency is decreased because a resistance of the electrolytic solution is added. When the cell gap is realized thinner than the total thickness of the metal grid 81 and protective layer 82, frequently the short circuit is generated due to the contact between the metal grid 81 and the counter electrode. On the other hand, in the first embodiment, the short circuit can be prevented even if the cell gap is formed thinner than the total thickness of the metal grid 81 and protective layer 82.

There is no particular limitation to the kind of the counter electrode 43 as long as the counter electrode 43 if formed by a conductive substrate. A conductive metal such as titanium, aluminum, and nickel can be cited as an example of the counter electrode 43. In the counter electrode 43, in order to promote the redox reaction of the electrolytic solution, a catalyst is provided in a surface contacting the electrolytic solution. Examples of the catalyst include platinum, graphite, and an organic polymer. The catalyst is provided on the counter electrode by platinum sputtering, a method of reducing a platinum colloid solution, graphite application, or organic polymer spin coating.

As described above, the need for decreasing the cell gap arises in the dye sensitized solar cell. The distance corresponding to a difference between the metal grid and the cell gap is previously formed by a milling machine or etching, and an irregularity is provided in the counter electrode 43, which allows the cell gap to be decreased. Because the counter electrode 43, the metal grid 81, and the protective layer 82, formed in the above-described manner, have the complicated shapes, the short circuit is easily generated because of the breakage of the protective layer when the cell gap is shortened. Accordingly, in the first embodiment, a chassis 44 is provided in the counter electrode 43 to be able to achieve both the prevention of the short circuit and the decrease in cell gap. The chassis 44 constituting the counter electrode has a width d2 larger than a width d1 of a portion which does not contribute to the power generation due to the wiring and protective layer. The detailed structure will be described below.

The chassis 44 constituting the counter electrode is provided in order to prevent the protective layer and metal grid from contacting the counter electrode to generate the short circuit. A particular point to be protected does not exist for the counter electrode, while the protective layer is provided in the metal grid for the transparent conductive oxide. Therefore, desirably, the chassis 44 constituting the counter electrode is provided so as to contact the counter electrode. Although, there is no particular limitation to a material of the chassis 44 constituting the counter electrode, desirably, the chassis 44 is made of a dielectric material having an electric insulating property. A glass frit material containing alkali or bismuth and a hydrocarbon resin can be used as the chassis 44. There is no particular limitation to the thickness of the short-circuit preventing layer as long as the metal grid or protective layer is not broken when the cell gap is defined. When the short-circuit preventing layer preferably has the thickness of 10 nm to 10 µm, advantageously, the cell gap is not carelessly increased while the short circuit is prevented. When the short-circuit preventing layer has the thickness lower than 10 nm, the short-circuit preventing effect is not exerted, the short-circuit preventing layer is easily broken in sealing the solar cell. On the other hand, when the short-circuit preventing layer is 10 µm or more, the cell gap is unfavorably increased.

In the first embodiment, the short-circuit preventing layer having the width d2 is provided, and the width d2 is larger than the width d1 of the portion which does not contribute to the power generation due to the metal grid and protective layer. When the width d2 is smaller than the width d1, the short-circuit preventing layer possibly damages the protective layer.

The method of bonding the transparent conductive oxide and the counter electrode will be described below. The predetermined cell gap can be realized between the transparent conductive oxide and the counter electrode by applying an even pressure with a sealing machine. When the substrate having the complicated irregular structure is used in the present invention, sometimes an edge of the irregular surface of the substrate contacts the metal grid and protective layer. Accordingly, the short-circuit preventing layer effectively prevents the substrate from contacting the metal grid and protective layer.

The electrolytic solution 51 is injected between the transparent conductive oxide 23 and the counter electrode 43. Examples of an electrolytic component contained in the electrolytic solution 51 include a liquid electrolyte in which the iodine and iodide ion, tertiary butyl pyridine, and the like are dissolved in an organic solvent such as ethylene carbonate and methoxy acetonitrile and a gel electrolyte which turns into a gel by adding a gelling agent such as polyvinylidene fluoride, polyethylene oxide derivative, and amino acid derivative into the liquid electrolyte.

Second Embodiment

Figure 2:
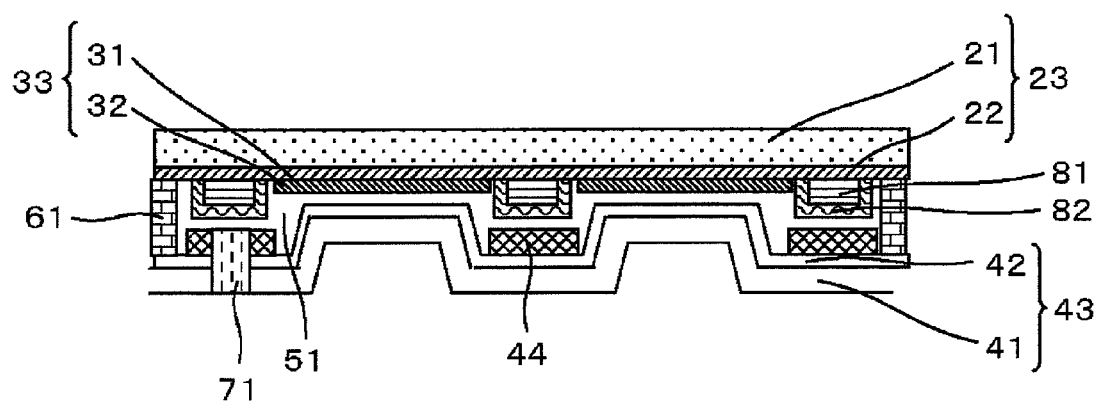
FIG. 2 is a sectional view showing a main part of a dye sensitized solar cell according to a second embodiment of the invention.

The counter electrode 43 can be formed by die press using a metal plate or metal foil. FIG. 2 is a sectional view showing a dye sensitized solar cell according to a second embodiment of the invention.

In this case, the counter electrode 43 can be formed into the shape shown in FIG. 2 by press working with a die. In the counter electrode formed as shown in FIG. 2, because the thickness of the counter electrode substrate can be thinned, the weight of the dye sensitized solar cell can effectively be reduced.

A conductive metal such as titanium, nickel, and aluminum can be used as the metal plate for the press working, and there is no particular limitation to the conductive metal as long as the die press can be performed.

In the second embodiment, the short-circuit preventing layer is provided so as to have a width larger than the width d1 of the portion which does not contribute to the power generation due to the metal grid and protective layer. In the second embodiment, a complicated pattern is hardly pressed because the counter electrode is formed by the die press. Accordingly, the short-circuit preventing layer can prevent the press from breaking the metal grid and protective layer which do not contribute to the power generation.

Third Embodiment

Figure 3:
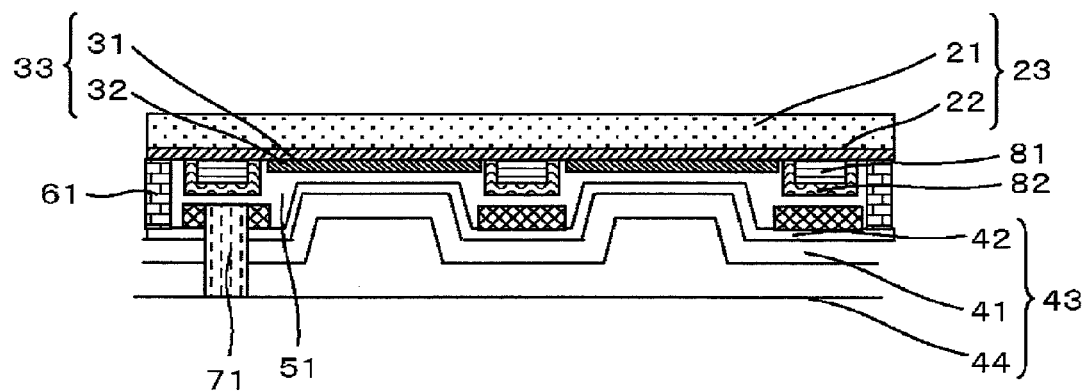
FIG. 3 is a sectional view showing a main part of a dye sensitized solar cell according to a third embodiment of the invention.
Figure 4:
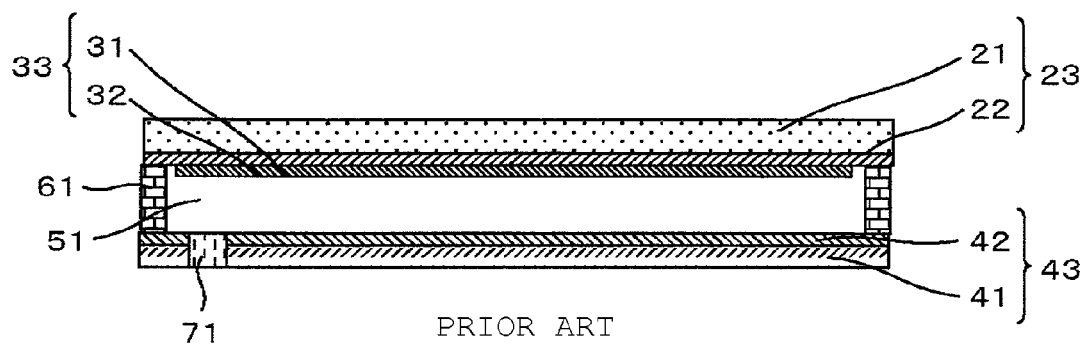
FIG. 4 is a schematic sectional view explaining an outline of a conventional dye sensitized solar cell.
Figure 5:
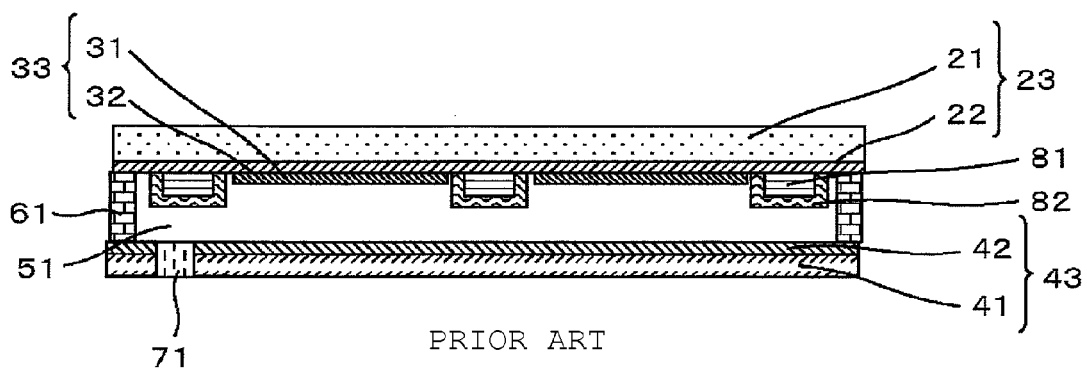
FIG. 5 is a schematic sectional view showing a conventional enlarged dye sensitized solar cell.

In the counter electrode 43, in order to act as the electrode, it is only necessary to pair the conductive portion with the portion having the light transmission property in the transparent substrate 22, and it is not always necessary to the whole of the counter electrode 43 be made of the metal. As shown in the structure of FIG. 3, the conductive substrate 41 is formed thin, and the chassis 44 supports the substrate 41.

There is no particular limitation to the material of the chassis 44 as long as the chassis 44 has rigidity enough to support the conductive substrate 41. Desirably, the light-weight material is used as the chassis 44 in order to reduce the weight of the dye sensitized solar cell, and desirably, the cured resin such as polycarbonate and an epoxy resin is used from the standpoint of cost.

When the chassis 44 is made of a dielectric material, the chassis 44 can also be used as the short-circuit preventing layer. In such cases, there is no particular limitation to the thickness of the short-circuit preventing layer.

In the third embodiment, similarly to the first and second embodiments, the short-circuit preventing layer is provided so as to have a width larger than the width d1 of the portion which does not contribute to the power generation due to the metal grid and protective layer.

EXAMPLES

The implementation results of the invention will be described in detail to demonstrate the effect of the invention. The method of demonstrating the effect of the invention is not limited to the following examples.

(Preparation of Dye Sensitized Solar Cell)

A silver paste (product of Tanaka Kikinzoku) was applied in a lattice shape by the screen printing onto a substrate (product of Geomatic) in which a transparent electrode was deposited on the glass substrate having a size of 100 mm by 100 mm. Then, a titanium oxide paste was applied by the screen printing to the portion in which the lattice wiring was not formed, and burning was performed at 450° C. for one hour to form the porous oxide semiconductor layer. Then, the lattice wiring was coated with the thickness of 30 μm using a hydrocarbon resin. Then, the substrate was dipped in an ethanol solution (concentration $3 \times 10^{-4}$M) of N719 dye (product of Solaronix) to form the dye-adsorbed semiconductor layer. The transparent conductive oxide and various kinds of counter electrodes shown below were laminated, and the electrolytic solution is sandwiched between the transparent conductive oxide and the counter electrode to form the wet solar cell. An ionic liquid (1-ethyl-3-methylimidazolium-bis-trifluoromethyl-sulfonyl-imide) containing an iodine/iodide ion redox pair was used as the electrolytic solution.

Example 1

The electrode was formed by etching a titanium substrate (thickness of 1 mm) having the size of 100 mm by 100 mm such that the shape shown in FIG. 1 was obtained. The platinum having the thickness of 20 nm was deposited over the surface of the substrate by sputtering. The titanium oxide layer having the thickness of 100 nm was provided in the portion which faced the protective layer of the counter electrode, that is, the etched portion. The gap was formed between the counter electrode and the transparent electrode, and the electrolytic solution was injected into the gap and sealed.

Example 2

In a titanium substrate (thickness of 300 μm), the titanium oxide layer having the thickness of 100 nm was provided in the portion which faced the protective layer provided on the transparent conductive oxide, and the electrode was formed by the press working such that the shape of FIG. 2 was obtained. Then, the electrode was cut so as to be matched with the size of 100 mm by 100 mm. The platinum having the thickness of 20 nm was deposited over the surface of the substrate by sputtering. The gap was formed between the counter electrode and the transparent electrode, and the electrolytic solution was injected into the gap and sealed.

Example 3

A polycarbonate substrate (thickness of 500 μm) having the size of 100 mm by 100 mm was formed by the milling machine such that the shape of FIG. 3 was obtained. Then, the titanium having the thickness of 300 nm and the platinum having the thickness of 20 nm were sequentially deposited over the surface of the substrate by sputtering. The gap was formed between the counter electrode and the transparent electrode, and the electrolytic solution was injected into the gap and sealed.

Example 4

The polycarbonate substrate (thickness of 500 μm) having the size of 100 mm by 100 mm was formed by the milling machine. A mask was formed on the substrate, electroless plating of nickel was performed, and plating was performed to obtain the nickel layer having the total thickness of 100 μm. Then, electroless plating of platinum was performed to obtain the platinum layer having the thickness of 20 nm, thereby preparing the counter electrode having the shape of FIG. 3. The gap was formed between the counter electrode and the transparent electrode, and the electrolytic solution was injected into the gap and sealed.

Comparative Example 1

The conductive film made of the platinum having the thickness of 20 nm was deposited on the titanium plate having the size of 100 mm by 100 mm to form the counter electrode by sputtering. The gap was formed between the counter electrode and the transparent conductive oxide, and the electrolytic solution was injected into the gap and sealed.

Comparative Example 2

Preparation of Mini-Cell

In a mini-cell whose transparent conductive oxide having an area of 2 to 4 cm$^2$, the transparent conductive oxide has a small resistance, so that performance can be ensured with no metal grid. The solar cell structure can be simplified to decrease the cell gap. Similarly to the examples 1 to 4, the transparent electrode was deposited on a glass substrate having a size 2 cm by 2 cm to form the transparent conductive oxide. The mini-cell was prepared by the same method as Examples 1 to 4 while the metal grid was not provided.

The wet solar cells obtained in Examples 1 to 4 and Comparative Example 1 were connected to a voltage-current measuring apparatus, a solar simulator was used as a light source, the wet solar cells were illuminated from the transparent conductive oxide side with AM-1.5 and 1-Sun pseudo-solar light having light intensity of 100 mW/m$^2$, and a voltage-current density characteristic was measured. Table 1 shows the measurement results.

As shown in Table 1, Examples 1 to 4 have the large fill factors, and Examples 1 to 4 act as the solar cell. On the other hand, the solar cell of Comparative Example 1 has the small fill factor due to the leak current caused by the breakage of the protective layer. The mini-cell of Comparative Example 2 exerts the large fill factor due to the effect of the decrease in cell gap. Because the fill factors of Examples 1 to 4 are equal to or larger than that of Comparative Example 2, it is believed that the similar effect of the decrease in cell gap is obtained.

TABLE 1

|  | Cell gap (μm) | Fill factor |
| --- | --- | --- |
| Example 1 | 15 | 0.65 |
| Example 1 | 16 | 0.64 |
| Example 1 | 16 | 0.65 |
| Example 1 | 18 | 0.68 |
| Comparative Example 1 | 103 | 0.25 |
| Comparative Example 1 | 15 | 0.64 |

According to the invention, the distance between the cells can be decreased as much as possible even if the dye sensitized solar cell is enlarged, so that the dye sensitized solar cell having the high photoelectric conversion efficiency can be provided at low cost.

What is claimed is:

1. A dye sensitized solar cell comprising:
a transparent conductive oxide which includes a transparent substrate and a conductive metal oxide having a light transmission property;
a metal grid which is formed on the transparent conductive oxide;
a protective layer with which the metal grid is coated;
a dye-adsorbed semiconductor thin film which is formed on the transparent conductive oxide in a region in which the metal grid is not formed; and
a counter electrode substrate which is provided with an injection hole for injecting an electrolytic solution, wherein the electrolytic solution is injected between the transparent conductive oxide and the counter electrode substrate,
wherein a short-circuit preventing layer is provided on the counter electrode substrate facing the metal grid, and
a width formed by a short side of the short-circuit preventing layer is larger than a width formed by the metal grid and protective layer,
wherein the counter electrode substrate is configured such that a first distance between the counter electrode substrate and a part of the transparent conductive oxide in which the dye-adsorbed semiconductor thin film is formed is shorter than a second distance between the counter electrode substrate and a part of the transparent conductive oxide in which the metal grid is formed, and
wherein the injection hole is formed in a part of the counter electrode substrate facing the metal grid,
a gap is interposed between the protective layer and the short-circuit preventing layer,
the dye-absorbed semiconductor thin film comprises parts adjacent to each other across the metal grid,
spaces between the parts of the dye-absorbed semiconductor thin film and the counter electrode substrate communicate through the gap, and
the electrolytic solution is injected through the short-circuit preventing layer into the spaces and the gap.

2. The dye sensitized solar cell according to claim 1, wherein at least a part of the counter electrode substrate is made of metal.

3. The dye sensitized solar cell according to claim 1, wherein a resin substrate is used in at least a part of the counter electrode substrate.

4. The dye sensitized solar cell according to claim 1, wherein the counter electrode substrate includes at least one of a metal and a catalytic layer, the metal promoting catalytic action of a redox mediator, the catalytic layer being made of an organic compound.

5. The dye sensitized solar cell according to claim 1, wherein a space formed between the transparent conductive oxide and the counter electrode substrate is filled with the electrolytic solution.

6. The dye sensitized solar cell according to claim 1, wherein the short-circuit preventing layer is formed on the counter electrode substrate facing the metal grid.

7. The dye sensitized solar cell according to claim 6, wherein the short-circuit preventing layer faces the metal grid coated by the protective layer.

8. A dye sensitized solar cell comprising:
a transparent conductive oxide including a transparent substrate and a conductive metal oxide having a light transmission property;
a metal grid formed on the transparent conductive oxide, the metal grid being coated with a protective layer;
a dye-adsorbed semiconductor thin film formed on areas of the transparent conductive oxide where the metal grid is not formed;
a counter electrode substrate;
a short-circuit preventing layer formed on the counter electrode substrate, the short-circuit preventing layer facing the metal grid;
a gap interposed between the protective layer and the short-circuit preventing layer; and spaces formed between the counter electrode substrate and the dye-absorbed semiconductor thin film in the areas where the dye-absorbed semiconductor thin film is formed, the spaces communicating through the gap, wherein a width formed by a short side of the short-circuit preventing layer is larger than a width formed by the metal grid and protective layer, wherein the counter electrode substrate is configured such that a first distance between the counter electrode substrate and one of the areas of the transparent conductive oxide in which the dye-adsorbed semiconductor thin film is formed is shorter than a second distance between the counter electrode substrate and a part of the transparent conductive oxide in which the metal grid is formed, and wherein an electrolytic solution is disposed through the short-circuit preventing layer between the transparent conductive oxide and the counter electrode substrate, and the electrolytic solution fills the spaces and the gap.

9. The dye sensitized solar cell according to claim 8, wherein at least a part of the counter electrode substrate is made of metal.

10. The dye sensitized solar cell according to claim 8, wherein a resin substrate is used in at least a part of the counter electrode substrate.

11. The dye sensitized solar cell according to claim 8, wherein the counter electrode substrate includes at least one of a metal and a catalytic layer, the metal promoting catalytic action of a redox mediator, the catalytic layer being made of an organic compound.

* * * * *